(12) United States Patent
Yamasaki

(10) Patent No.: US 6,864,505 B2
(45) Date of Patent: Mar. 8, 2005

(54) ELECTRO-OPTICAL DEVICE AND ELECTRONIC APPARATUS

(75) Inventor: Yasuji Yamasaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 30 days.

(21) Appl. No.: 10/418,211

(22) Filed: Apr. 18, 2003

(65) Prior Publication Data

US 2004/0016931 A1 Jan. 29, 2004

(30) Foreign Application Priority Data

Apr. 25, 2002 (JP) .......................................... 2002-124933
Apr. 7, 2003 (JP) .......................................... 2003-102873

(51) Int. Cl.$^7$ ..................... H01L 29/021; H01L 31/036; H01L 31/0376; H01L 31/20
(52) U.S. Cl. ............................ 257/59; 257/57; 257/347; 438/149; 438/479; 438/517
(58) Field of Search ............................. 257/57, 59, 347; 438/149, 479, 517

(56) References Cited

U.S. PATENT DOCUMENTS

| | | | | | |
|---|---|---|---|---|---|
| 5,339,181 | A | * | 8/1994 | Kim et al. ..................... | 349/38 |
| 5,367,179 | A | * | 11/1994 | Mori et al. .................... | 257/59 |
| 5,515,187 | A | * | 5/1996 | Nakamura et al. ............ | 349/42 |
| 5,844,255 | A | * | 12/1998 | Suzuki et al. ................. | 257/59 |
| 6,226,059 | B1 | * | 5/2001 | Yamamoto et al. ........... | 349/42 |
| 6,521,913 | B1 | * | 2/2003 | Murade ........................ | 257/59 |

* cited by examiner

*Primary Examiner*—Allan R. Wilson
*Assistant Examiner*—Edgardo Ortiz
(74) *Attorney, Agent, or Firm*—Oliff & Berridge, PLC

(57) ABSTRACT

The invention provides an electro-optical device that can include a pixel electrode, a thin-film transistor (TFT) including a semiconductor layer connected to the pixel electrode, and a data line and scanning line connected to the TFT. The scanning line can include a narrow part as a gate electrode facing a channel region in the semiconductor layer, and a wide part not facing the channel region.

Such construction permits the electro-optical device to display high quality images by preventing light from impinging the TFT.

23 Claims, 10 Drawing Sheets

ELECTRO-OPTICAL DEVICE AND ELECTRONIC APPARATUS

BACKGROUND OF THE INVENTION

1. Field of Invention

The invention relates to a technical field of electro-optical devices and electronic apparatus. Particularly, the invention relates to an electro-optical device capable of so-called active matrix addressing by providing a thin film transistor (TFT) on one of two substrates having an electro-optical substance, such as a liquid crystal, interposed between the substrates, and an electronic apparatus having such an electro-optical device.

2. Description of Related Art

Conventional electro-optical devices capable of so-called active matrix addressing can include pixel electrodes arranged as a matrix, TFTs connected to the electrodes, and scanning lines and data lines aligned parallel to column and row directions, respectively, of the matrix, whereby operation of the TFT is controlled by supplying scanning signals to the TFT via the scanning lines, and image signals are supplied to the TFTs and pixel electrodes via the data lines. The need for a small size electro-optical device capable of displaying improved quality of images has been has increased in recent years.

Although various problems should be solved for satisfying such requirement, among all of them, it is important to overcome the problems concerning incidence of light to the TFT provided at each pixel, particularly, to a channel region in the semiconductor layer. This is because a leak photocurrent can occur by photo-excitation caused by irradiation of light onto the channel region, and images on the display are flickered due to change of characteristics of the TFT. In particular, when the electro-optical device capable of active matrix addressing is used as a light bulb for a liquid crystal projector, shielding of the incident light to the channel region of the TFT and peripheral region thereof becomes more important since the intensity of the incident light to the light bulb is high.

Accordingly, conventional electro-optical devices have been constructed so that the light is blocked from arriving at the channel region and the peripheral regions thereof by providing a light shielding layer for restricting an opening region of each pixel on a counter substrate facing a TFT array substrate on which the TFT is mounted with interposition of an electro-optical substance such as a liquid crystal between the two substrates. Alternatively, the electro-optical device has been constructed so that data lines made of a metal film, such as an Al (aluminum) film, that runs on the TFT is used as the light shielding layer on the TFT array substrate. Such construction prevents the light from impinging into the TFT and its channel region of the electro-optical device, that is, the leak photocurrent is prevented from occurring.

However, the light shielding technology as described above involves the following problems. According to the technology for forming the light shielding layer on the counter substrate or above the TFT array substrate, the light shielding layer is considerably separated from the channel region in a three dimensional construction consisted of, for example, a liquid crystal layer, electrodes, interlayer insulating layers and others, thus the light impinging into the space between the light shielding layer and the channel region from an inclined direction is not sufficiently shielded. In particular, in the small size electro-optical device, using a light bulb for the projector, the light flux of the incident light from a light source is converged with a lens, and contains considerable inclined components of incident light that cannot be disregarded (about 10% of the light component, which is 10° to 15° aslant from the direction perpendicular to the substrate). Accordingly, insufficient shielding of such inclined incident light arises as a practical problem.

SUMMARY OF THE INVENTION

Miniaturization of the electrooptical device as well as reduction of pixel pitches are advancing in order to comply with general requirements of reducing the size of the electro-optical device described above, while the intensity of the incident light tends to be increased for displaying bright images in compliance with general requirements of high quality image display. Consequently, sufficient light shielding by conventional light shielding techniques, described above, has become more difficult.

The object of the invention, in view of the problems above, is to provide an electro-optical device that is able to display high quality images by preventing the light from impinging the TFT, and an electronic apparatus comprising the electro-optical device.

In a first embodiment, the present invention provides an electro-optical device having a pixel electrode provided above a substrate, a thin film transistor for supplying image signals to the pixel electrode by a switching operation of the thin film transistor, a first wiring line for supplying the image signals to the thin film transistor, and a second wiring line for supplying scanning signals to the thin film transistor for controlling the switching operation of the thin film transistor. The second wiring line can include a narrow part as a gate electrode facing the channel region of the thin film transistor, and a wide part wider than the narrow part and not facing the channel region.

According to the electro-optical device in the first embodiment of the invention, so-called active matrix addressing can be realized since ON/OFF control is possible by supplying scanning signals to the thin film transistor via the second wiring line, and image signals can be supplied to the pixel electrode via the first wiring line when the thin film transistor is turned ON. Particularly in this invention, the second wiring line may include a narrow part as a gate electrode facing the channel region of the thin film transistor, and a wide part wider than the narrow part and not facing the channel region. This means that the second wiring line of the invention is arranged like an open umbrella in the peripheral region of the channel region. This arrangement blocks the light impinging to the channel region of the thin film transistor by the wide part of the second wiring line according to the invention. This shielding effect is effectively exhibited, particularly, against a light impinging aslant to the channel region. Consequently, leak photocurrent may be suppressed as much as possible from occurring in the thin film transistor of the invention, and high quality images are displayed without flickering.

In this invention, the word "wide" refers to as meaning of wider against the width of the "narrow part", and the word "narrow" refers to as meaning of narrower against the width of the "wide part". This means that the actual extent of "wide part" or "narrow part" is determined by a relative relation between them.

In relation to the description above, the extent of the actual width of the wide part or narrow part, may be appropriately determined based on a theoretical, empirical or experimental basis, or by simulation, by taking in account the degree of the light shielding effect, keeping a particular aperture ratio of the pixel, or other constituting elements on the substrate and layout thereof. In a typical example, in which a lattice of the light shielding layer is formed on a counter substrate facing the substrate with interposition of an electro-optical substance between the substrates, the wide part may be formed with an width not exceeding the width of the light shielding layer. Since the wide part is confined within the non-opening region, the aperture ratio of the pixel is not affected by the wide part.

While typical examples of the electro-optical substance as used in the invention include the liquid crystal as described above, an EL (electro luminescence) powder, dispersed in an appropriate binder, or an inorganic or organic EL substance may be included. While the image is displayed by a mechanism, in which an electric field is applied to the EL substance to emit a light by the EL substance itself, the invention can be naturally applied in this case since such EL display may include the TFT, the second wiring line and the first wiring line as described above.

In a second embodiment, the present invention can provide an electro-optical device having pixel electrodes provided above a substrate, a thin film transistor for supplying image signals to the pixel electrode by a switching operation of the thin film transistor, a first wiring line for supplying the image signals to the thin film transistor, a second wiring line for supplying scanning signals to the thin film transistor for controlling the switching operation of the thin film transistor, and an electrode part, electrically connected to the second wiring line, having a narrow part as a gate electrode facing the channel region of the thin film transistor, and a wide part wider than the narrow part and not facing the channel region.

Active matrix addressing is possible in the electro-optical device according to the second embodiment of the invention by almost the same method as in the electro-optical device according to the first embodiment of the invention. However, the scanning signals are supplied to the thin film transistor via the electrode part as well as via the second wiring lines.

Accordingly, the electro-optical device can include the electrode part including the narrow part and wide part, and the electrode part is electrically connected to the second wiring line, particularly, in the second embodiment of the invention. This construction permits the degree of freedom of layout, such as arrangement of the thin film transistor to be enhanced by forming, for example, the second wiring line and electrode part on a different layer of the substrate. In addition, the second wiring line may be formed of a material excellent in conductivity while forming the electrode part using a material excellent in light shielding.

Anyhow, since the wide part can shield the light to the channel region in the electro-optical device in the second embodiment, as in the electro-optical device in the first embodiment of the invention, higher quality of images may be also displayed by suppressing the leak photocurrent from occurring.

In one aspect of the second embodiment of the electro-optical device of the invention, the electrode part is electrically connected to the second wiring line via a contact hole. According to this embodiment, both elements may be formed as different layers with interposition of, for example, at least one interlayer insulating layer, by electrically connecting the electrode part to the second wiring line via the contact hole, enabling the freedom of layout of various constituting elements on the substrate.

At least a part of the wide part includes a region overlapping the first wiring line in a plan view in one aspect of the first embodiment of the electro-optical device according to the invention, and in another aspect of the second embodiment of the electro-optical device according to the invention.

A higher light shielding function may be exhibited since the light invading from the upward of the first wiring lines is shielded at the upper face of the fast wiring line, and the light, permeating through it, is shielded by the upper face of the wide part, when a laminated structure having the channel region, the second wiring line or the electrode part including the wide part, and the first wiring line are formed in this order from the bottom. Since the fact that the first wiring line overlaps the wide part in a plan view means that the passageway of the light for invading into the channel region is restricted, a higher light shielding function may be achieved by this construction.

In a different aspect in the first or second embodiment of the electro-optical device of the invention, the wide part may include a portion extended from the narrow part. According to this embodiment, the second wiring line or the electrode part comprising the wide part and narrow part can be rather easily formed. For example, the second wiring line or the electrode part according to the embodiment may be readily formed using photolithography and etching known in the art, on the premise that a so-called integrated pattern of the wide part and narrow part is formed.

In a different aspect in the first or second embodiment of the electro-optical device of the invention, the wide part includes the portion connected from the narrow part. According to this embodiment, the wide part includes, for example, a portion formed by connecting an independently prepared conductive member to the narrow part. Even in this case, the wide part may be rather easily formed.

It is also possible in this case to construct the narrow part and wide part with different materials, so that the narrow part that is expected to function as a gate electrode may be formed of a material suitable for this purpose, and the wide part that is expected to have a high light shielding performance may be formed of a different material suitable for this purpose. For example, the narrow part may be formed of conductive polysilicon, while the wide part may be formed of a light shielding material such as WSi (tungsten siliside) to be described hereinafter. This construction affords an advantage that the light shielding material, not always suitable to function as the gate electrode, is made not to take such a function, and a polysilicon layer is expected to take this function in place of the light shielding material. A high light shielding function may also be obtained by this construction.

In a different aspect in the first or second embodiment of the electro-optical device of the invention, the wide part has the light shielding material. According to this embodiment, the light shielding function is reliably exhibited by the wide part since the wide part is made of a light shielding material.

It is needless to say that only the wide part may be composed of the light shielding material, or the wide part as well as the narrow part may be composed of the light shielding material. It has been already mentioned that the former construction is favorably realized in the embodiment, in which the wide part includes a portion connected to the narrow part.

Examples of the light shielding material as used in this embodiment can include metals, alloys, metal siliside, polysiliside and a laminate thereof including at least one of high melting point metals, such as Ti (titanium), Cr (chromium), W (tungsten), Ta (tantalum) and Mo (molybdenum).

The second wiring lines or the electrode part can include a multilayer structure in the electro-optical device according to a different aspect in the first or second embodiment of the electro-optical device according to the invention.

According to this embodiment, the second wiring line or the electrode part may have a dual layer structure having a layer that effectively functions as the gate electrode, and a layer that takes the role for light shielding (examples of the materials of the former layer include polysilicon, and examples of the materials of the latter layer include high melting point metals such as Ti, Cr, W, Ta and Mo). Accordingly, the performance required for the second wiring line or the electrode part may be more preferably exhibited, thereby enabling favorable operations of the thin film transistor or the electro-optical device to be secured and sufficient light shielding performance to be exhibited.

In a different aspect in the first or second embodiment of the electro-optical device of the invention, the wide part is extended in one or both extending directions of the channel region viewed from the side line of the narrow part.

According to this embodiment, arrangement of the thin film transistor and the second wiring line or electrode part may be favorably adjusted since the wide part is extended in one or both extending directions of the channel region. The phrase extend the wide part in one direction can mean that, although one side line of the wide part is located on a straight line along the end of the channel region in the extending direction of the channel region, the other side line of the wide part is not located on a line parallel to the straight line along the end of the channel region. On the other hand, the phrase extend in both directions can mean that neither one side line nor the other side line of the wide part is not located on the straight line along the one and the other side lines of the channel region.

Since the portion to be the wide part relative to the narrow part can be freely determined in this embodiment, arrangement of the thin film transistor, the second wiring line and the electrode part may be favorably adjusted while enhancing the degree of freedom of layout of each constituting element on the substrate.

The actual degree of protrusion of the wide part with respect to the narrow part can be determined considering various situations as described above in the cases either the wide part is extended only in one direction or in both directions.

In a different aspect in the first or second embodiment of the electro-optical device of the invention, the pixel electrodes are arranged as a matrix, and the channel region is formed in each cross point region where a slender first space, extending so as to thread through the adjoining pixel electrodes with interposition of the second wiring line, intersects a slender second space, extending so as to thread through the adjoining pixel electrodes with interposition of the first wiring line.

A construction, which is most likely to block the light impingement, is formed by forming the channel region of the thin film transistor in the cross point region in this embodiment. Accordingly, the leak photocurrent is more reliably suppressed from occurring in the electro-optical device of this embodiment with a synergetic effect of the wide part of the invention, thereby enabling high quality images to be displayed.

The phrase arrange as a matrix, as used in this embodiment can refer to as not only a simple matrix in which the pixel electrodes are linearly arranged crosswise, but also a staggered or a meandering arrangement of the pixels, which is applied only at least either the vertical or the transverse direction. Particularly, the channel region, the source region and the drain region are formed so as to be extended along the second space, and the width of the narrow region is equal to the length of the channel region along the second space while the width of the wide part is larger than the above mentioned length in this embodiment.

According to this construction, the thin film transistor is formed so that the direction of the so-called channel length (the length along the second space of the channel region described above) is the same as the direction of the second space. Consequently, the width of the narrow part is the same as the channel length, and the width of the wide part is larger than the channel length. Such construction may embody one of the most suitable arrangement of the thin film transistor, the channel region and the second wiring lines, or the electrode part, and favorable arrangement of the first wiring line and pixel electrode may be determined based on the above arrangement.

In a different aspect in the first or second embodiment of the electro-optical device of the invention, a lower side light shielding layer is further provided under the thin film transistor. According to this embodiment, light is more reliably prevented from impinging the thin film transistor. In other word, the light invading into the channel region from the upper and lower sides is shielded when the wide part according to the invention is provided above the thin film transistor, while double shielding is possible in the lower side when the wide part is provided below the thin film transistor.

For example, when the electro-optical device according to the invention is used as a light bulb in a projection type display device capable of color display, a set of three light bulbs (electro-optical devices) corresponding to three colors of red, blue and green, are provided facing one set of prisms. In this case, a light permeating through an electro-optical device corresponding to the blue color impinges an electro-optical device corresponding to the red color facing the electro-optical device corresponding to the blue color. This light impinges from below the thin film transistor as a return light.

Since the lower side light shielding layer according to this embodiment is able to shield the light impinging from below the thin film transistor, possibility of leak photocurrent occurrence can be further reduced in the thin film transistor.

The electronic apparatus of the invention can include the first or second embodiments of the electro-optical device of the invention described above (including those in various aspects).

Since the electronic apparatus of the invention includes the electro-optical device having excellent light shielding performance to the thin film transistor, embodiments thereof include various electronic apparatus which can display the high quality image with no flickering, such as a projection type display device (liquid crystal projector), liquid crystal television, portable phone, electronic notebook, word processor, view finder or monitor direct-view video tape recorder, work station, television phone, POS terminal and touch panel.

BRIEF DESCRIPTION OF THE DRAWINGS

The invention will be described with reference to accompanying drawings, wherein like numerals reference like elements, and wherein.

DETAILED DESCRIPTION OF PREFERRED EMBODIMENTS

Embodiments of the invention will be described hereinafter with reference to the drawings. The following embodiments describe the electro-optical device of the invention applied to liquid crystal devices.

Figure 1:
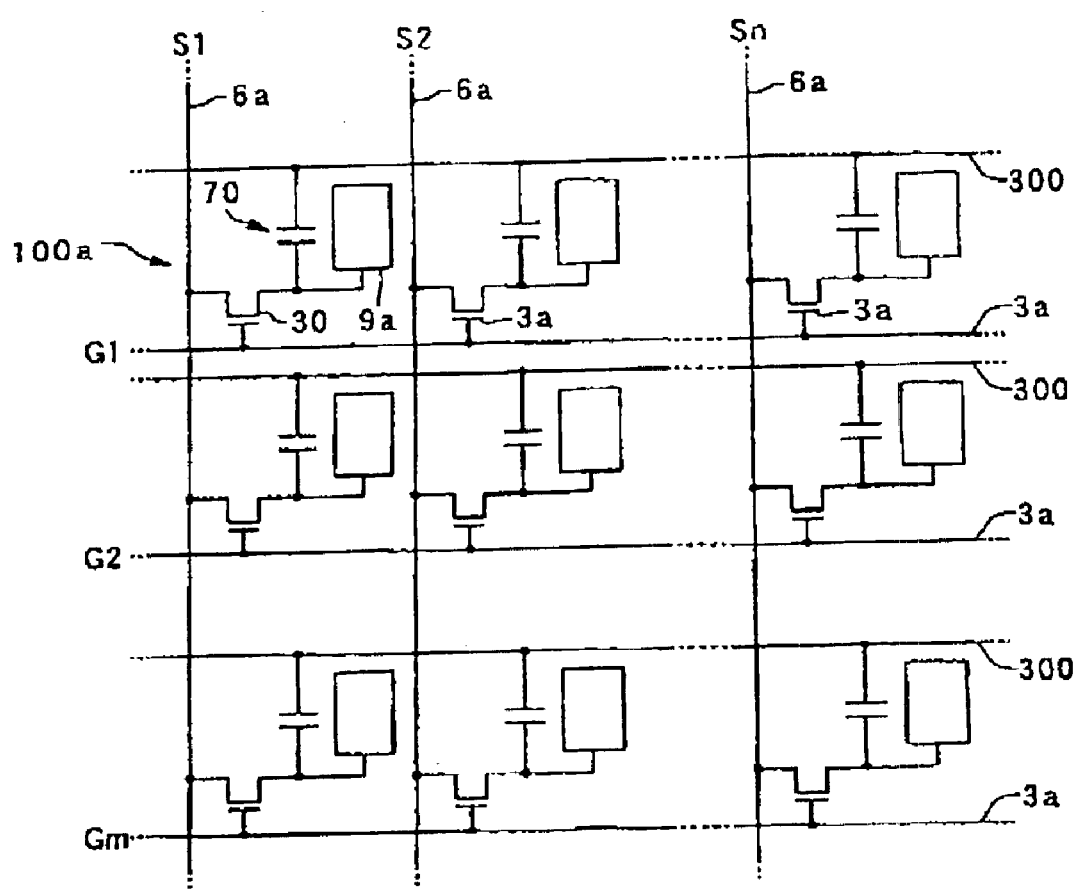
FIG. 1 is a circuit diagram showing an equivalent circuit of various elements and wiring lines provided in a matrix of a plurality of pixels constituting an image display region in the electro-optical device in the first embodiment of the present invention.
Figure 2:
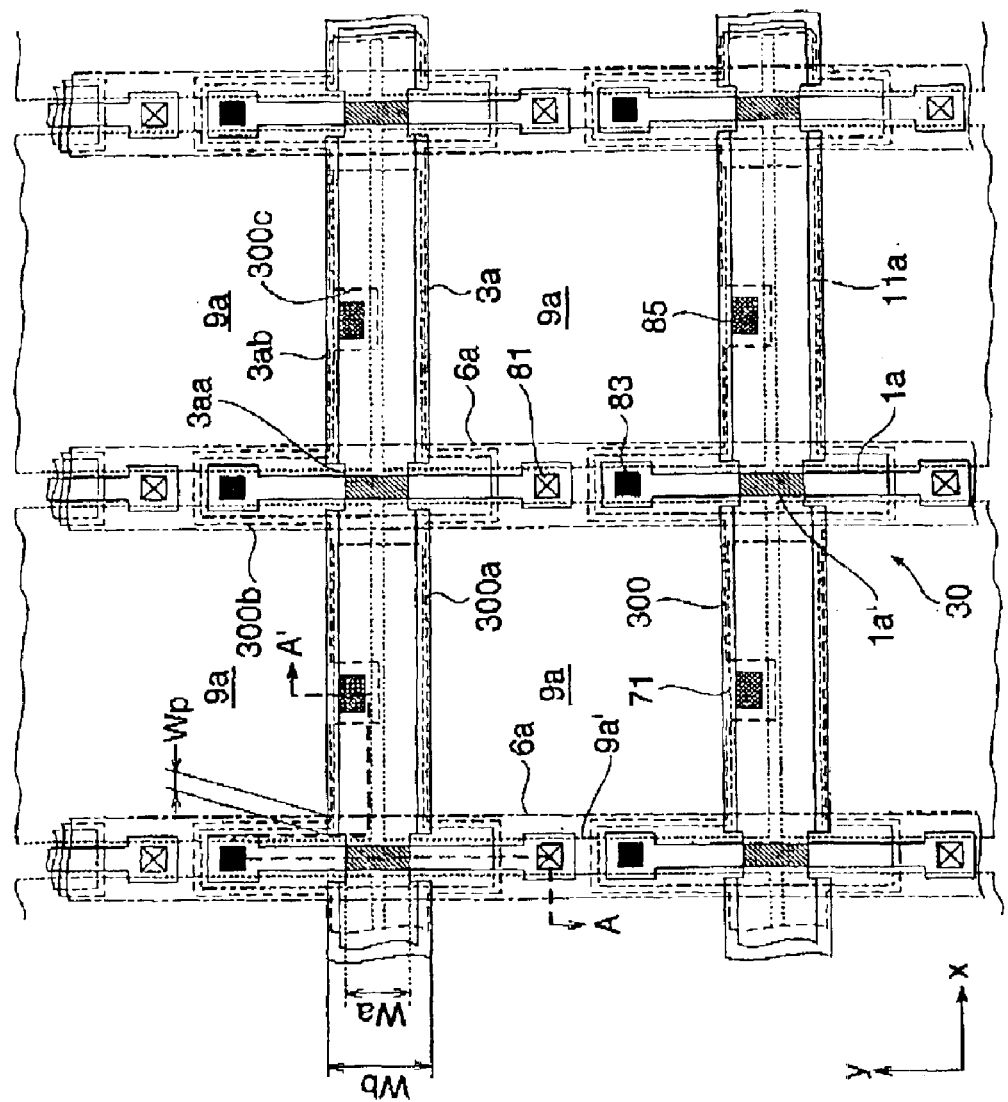
FIG. 2 is a plan view of a plurality of adjoining pixel groups on a TFT array substrate on which data lines, scanning lines and pixel electrodes are formed in the electro-optical device in the first embodiment of the present invention.
Figure 3:
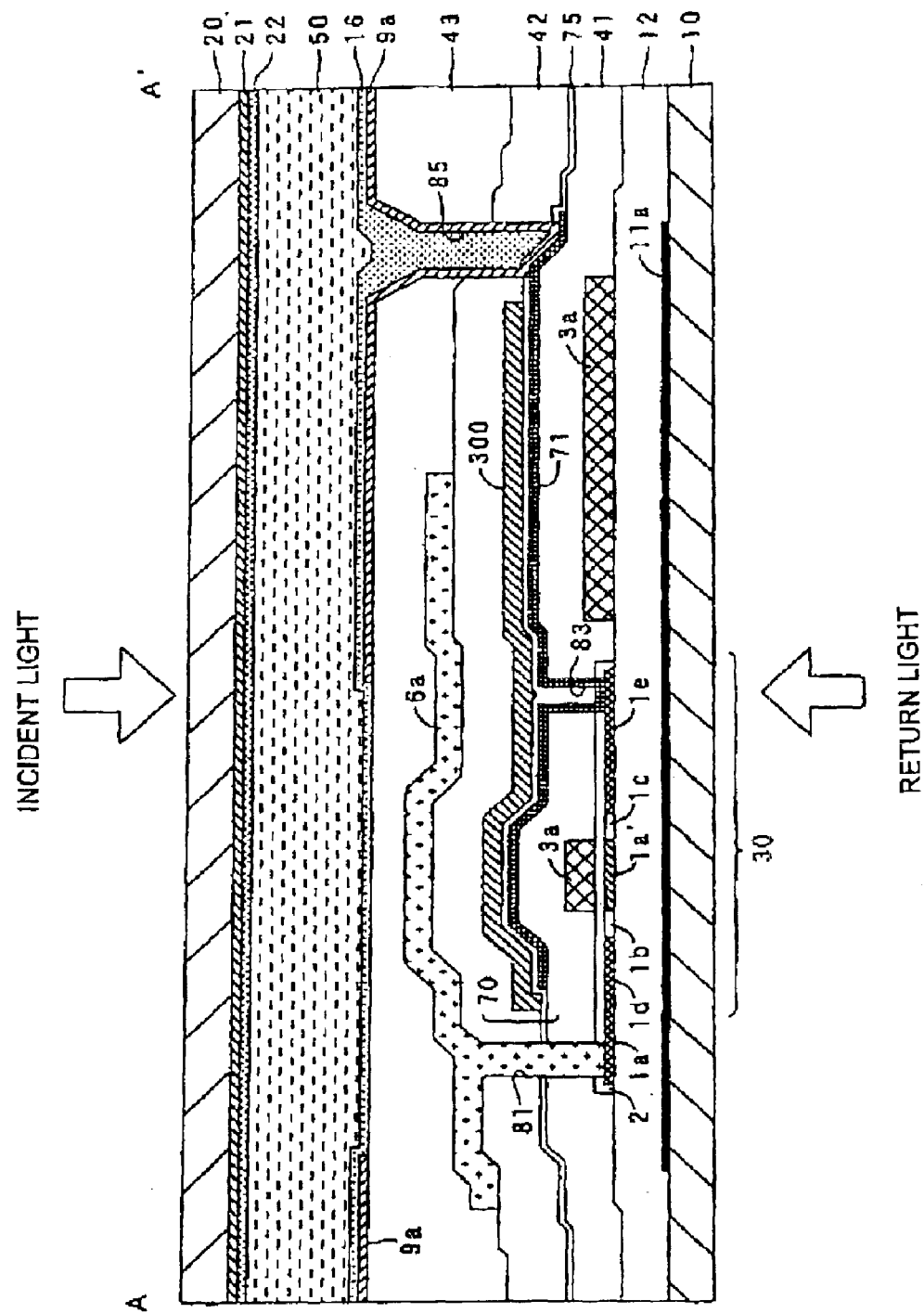
FIG. 3 is a cross sectional view along the line A—A' in FIG. 2.

The construction of pixel portions of the electro-optical device in the first embodiment of the invention is described with reference to FIGS. 1 to 3. FIG. 1 shows an equivalent circuit of various elements and wiring lines provided in a matrix of a plurality of pixels constituting an image display region in the electro-optical device in the first embodiment of the present invention. FIG. 2 is a plan view of a plurality of adjoining pixel groups on a TFT array substrate on which data lines, scanning lines and pixel electrodes are formed in the electro-optical device in the first embodiment of the present invention, and FIG. 3 is a cross sectional view along the line A—A' in FIG. 2. Scales of the drawing are different with respect to each layer and each member in FIG. 3 in order to exhibit them in sizes recognizable in the drawing.

In FIG. 1, a pixel electrode 9a and a TFT 30 for switching control of the pixel electrode 9a are formed on each of a matrix of a plurality of pixels constituting an image display region in the electro-optical device in the first embodiment, and a data line 6a, to which image signals are supplied, is electrically connected to a source of the corresponding TFT 30. The image signals S1, S2, ..., Sn written in the data line 6a may be sequentially supplied in this order to the data lines, or may be supplied to each group of the adjoining plural data lines 6a.

A scanning line 3a is electrically connected to each TFT 30, and scanning signals G1, G2, ..., Gm are sequentially supplied in this order to the signal lines 3a as pulses. A pixel electrode 9a is electrically connected to the drain of each TFT 30, and the image signals S1, S2, ..., Sn supplied from the data line 6a are written with a given timing by closing each TFT 30, which is a switching element, for a particular period of time.

The image signals S1, S2, ..., Sn, which have a given level and are written in a liquid crystal as an example of the electro-optical device via each pixel electrode 9a, are preserved for a given period of time between respective pixel electrodes and counter electrodes formed on a counter substrate. The liquid crystal modulates a light to enable gradation display by changing orientation and order of a molecular assembly depending on applied voltage levels. Transmittance ratio of the incident light decreases depending on the voltage applied to each pixel unit in a normally white mode, while transmittance ratio of the incident light increases depending on the voltage applied to each pixel unit in a normally black mode. Consequently, a light having a contrast depending on the image signals emerges as a whole from the electro-optical device.

For preventing the stored image signals from leaking, an accumulating capacitor 70 is added in parallel to the capacitor of the liquid crystal formed between the pixel electrode 9a and counter electrode. This accumulating capacitor 70 includes a capacitor line 300 provided in parallel to the scanning line and fixed at a constant potential.

More practical construction of the electro-optical device manifesting the operation of the circuit described above having the data line 6a, the scanning line 3a and the TFT 30 will be described below with reference to FIGS. 2 and 3.

The electro-optical device according to the first embodiment can include a transparent TFT array substrate 10 and a transparent counter substrate 20 disposed facing the TFT array substrate as shown in FIG. 3 as a cross sectional view along the line A—A' in FIG. 2. The TFT array substrate 10 is made of, for example, a quartz substrate, glass substrate or silicon substrate, and the counter substrate 20 is made of, for example, a quartz substrate or glass substrate.

As shown in FIG. 3, the TFT array substrate 10 can include a pixel electrode 9a and an orientation layer 16, subjected to an orientation treatment such as a rubbing treatment, is provided on the pixel electrode. The pixel electrode 9a, for example, has a transparent conductive layer, such as an ITO (indium tin oxide) layer. On the other hand, an counter electrode 21 is formed under the entire surface of the counter substrate 20, and an orientation layer 22, subjected to an orientation treatment such as a rubbing treatment, is formed under the counter electrode. The counter electrode 21 also can include, for example, the transparent conductive layer, such as an ITO (indium tin oxide) layer, as in the transparent pixel electrode 9a described above. The orientation layers 16 and 22 include, for example, transparent organic layers such as polyimide layers.

As shown in FIG. 2, a plurality of the pixel electrode 9a are provided on the TFT array substrate 10 as a matrix (contours are shown by dotted lines 9a'), and each data line 6a and scanning line 3a are provided along the vertical and transverse boundaries of the pixel electrode 9a. The data line 6a is formed along the space between the adjoining pixel electrodes 9a in the x-direction, or along the space extending in the y-direction in FIG. 2 (corresponds to the second space defined in the invention), and the material thereof is a metal layer, such as an aluminum layer or an alloy layer. On the other hand, the scanning line 3a is formed along the space between the adjoining pixel electrodes 9a in the y-direction, or along the space extending in the x-direction in FIG. 2 (corresponds to the first space defined in the invention). The scanning line 3a is disposed so as to face a channel region 1a', shown by oblique lines aslant from lower left to upper right in figure, in the semiconductor layer 1a, and a part of the scanning line 3a functions as a gate electrode. In other words, the TFT 30 for switching the pixels is provided at each cross point of the scanning line 3a and data line 6a (corresponds to a "cross point region" defined in the invention), in which the main line of the scanning line 3a faces the channel region 1a' as a gate electrode in the TFT.

The TFT 30 has a LDD (Lightly Doped Drain) structure as shown in FIG. 3, and the constituting elements thereof can include the scanning line 3a that functions as the gate electrode as described above, the channel region 1a' of the semiconductor layer 1a comprising a polysilicon layer, in which a channel is formed by the electric field from the scanning line 3a, an insulation layer 2 having a gate insulating layer for insulating the scanning line 3a from the semiconductor layer 1a, a low concentration source region 1b and a low concentration drain region 1c, and a high concentration source region 1d and a high concentration drain region 1e in the semiconductor layer 1a.

In the first embodiment, particularly, the scanning line 3a includes a narrow part 3aa as the gate electrode facing the channel region 1a' of the TFT 30, and a wide part 3ab not facing thereto. The narrow part 3aa and the wide part 3ab are formed on the same extended line. Accordingly, the scanning line containing the narrow part 3aa and wide part 3ab can be simultaneously and integrally formed using photolithography.

For example, the width Wa of the narrow part 3aa is determined to be equal to the length of the channel region 1a' in the direction interposed by the drain regions 1c and 1e and source regions 1b and 1d of the TFT 30, that is the channel length, as shown in FIG. 2, while the width Wb of the wide part 3ab is formed so as to satisfy a relation of Wb>Wa, and so as to protrude out of both side lines of the narrow part 3aa (that is, to protrude in both +y and −y directions in FIG. 2).

The scanning line 3a is formed so that the wide part 3ab thereof has a region overlapping the data line 6a in the plan view. More specific, for example, the boundary region between the narrow part 3aa and wide part 3ab in the scanning line 3a overlaps the side part of the data line 6a, as shown in the plan view in FIG. 2. FIG. 2 shows that this overlapping region has a width of Wp.

The scanning line 3a, having such narrow part 3aa and wide part 3ab, is formed of a light shielding material in the first embodiment. Examples of the light shielding material as used herein are metals, alloys, metal silisides, polysilisides, and laminates including at least one of high melting point metals such as Ti, Cr, W, Ta and Mo.

While the TFT 30, described above, has the LDD structure (see FIG. 3), it should be understood that the invention is not restricted thereto. For example, the TFT 30 may have an offset structure, in which impurities are not doped in the low concentration source region 1b and low concentration drain region 1c, or may be a self-aligned TFT, in which the high concentration source region and high concentration drain region are formed with self-aligning manner by doping high concentration impurities with using a gate electrode (or the narrow part 3aa) formed from a part of the scanning line 3a as a mask.

The semiconductor layer 1a constituting the TFT 30 may be either a non-single crystalline layer or a single crystalline layer. A method known in the art, such as bonding method, may be used for forming the single crystalline layer. Forming the semiconductor layer 1a with the single crystalline layer permits peripheral circuits to exhibit high performance.

The accumulating capacitor 70 can be formed by disposing a relay layer 71 as a pixel potential side capacitor electrode, connected to the high concentration drain region 1e of the TFT 30 and pixel electrode 9a, so as to face a part of a capacitor line 300 as a fixed potential side capacitor electrode via dielectric layer 75 as shown in FIG. 3. This accumulating capacitor 70 permits potential retaining characteristics of the pixel electrode 9a to be remarkably enhanced.

The relay layer 71 can include, for example, a conductive polysilicon layer, and functions as a pixel potential side capacitor electrode. However, the relay layer 71 may be composed of a monolayer or multilayer made of a metal or an alloy like a capacitor line 300, to be described hereinafter. The relay layer 71 functions as a relay connecting the pixel electrode 9a and TFT 30 via contact holes 83 and 85 in addition as the pixel potential side capacitor electrode.

The capacitor line 300 can include a conductive layer made of a metal or an alloy, and functions as a fixed potential side capacitor electrode. This capacitor line 300 is formed so as to overlap the region for forming the scanning line 3a, as shown in the plan view in FIG. 2. More specifically, the capacitor line 300 includes a main line part 300a extending along the scanning line 3a, a protruded part 300b upwardly protruding along the data line 6a from each position crossing the data line 6a, and a constricted part 300c, in which the position corresponding to the contact hole 85 is slightly constricted.

The protrusion part 300b contributes for increasing the region for forming the accumulating capacitor 70, using the region on the scanning line 3a and the region under the data line 6a (see FIG. 3). Such capacitor line 300 preferably can include a conductive light shielding layer made of a high melting point metal, and functions as a light shielding layer for shielding the TFT 30 from incident light above the TFT 30 in addition as the fixed potential side capacitor electrode of the accumulating capacitor 70. The capacitor line 300 is preferably extended from an image display region 10a, where the pixel electrode 9a is disposed, to the peripheral region thereof, and serves as a fixed potential by being electrically connected to a constant potential source. Such constant potential source may be a constant potential source, such as a positive power source or a negative power source supplied to a data line addressing circuit 101, or a constant potential supplied to the counter electrode 21 of the counter substrate 20.

A dielectric layer 75 can include a silicon oxide layer, such as HTO (high temperature oxide) layer, LTO (low temperature oxide) layer, or a silicon nitride layer with a relatively small thickness of about 5 to 200 nm as shown in FIG. 3. The smaller the thickness of the dielectric layer 75 is more preferable, so long as the layer is sufficiently reliable from the view point of increasing the capacitance of the accumulating capacitor 70.

A lower side light shielding layer 11a is further provided below the TFT 30 in FIGS. 2 and 3. The lower side light shielding layer 11a is patterned as a lattice, which defines an opening region of each pixel. The opening region may also be defined by the data line 6a and the capacitor line 300 formed to cross the data line as shown in FIG. 2. It is recommended to extend the lower side light shielding layer 11a from the image display region to the peripheral region thereof, in order to avoid potential changes of the light shielding layer from adversely affecting the TFT 30, as in the capacitor line 300 described above.

An insulating underlayer 12 is provided below the TFT 30. The insulating underlayer 12 functions as interlayer insulation between the lower side light shielding layer 11a and TFT 30, while preventing the characteristic change of the TFT 30 for pixel switching from being deteriorated due to roughness of the surface of the TFT array substrate 10 caused by surface grinding, or by contamination remaining after cleaning, by forming the layer over the entire surface of the TFT array substrate 10.

Furthermore, a first insulation interlayer 41 is formed on the scanning line 3a, in which a contact hole 81 communicating with the high concentration source region 1d, and a contact hole 83 communicating with the high concentration drain region 1e are formed through.

The relay layer 71 and capacitor line 300 are formed on the first insulation interlayer 41. The contact hole 81 communicating with the high concentration source region 1d, and a second insulation interlayer 42 is formed on the relay layer 71 and capacitor line 300b, in which the contact hole 85 communicating with the relay layer 71 is formed through.

Ions, injected into the polysilicon layers constituting the semiconductor layer 1a and scanning line 3a, may be activated by baking the first insulation interlayer 41 at about 1000° C. in the first embodiment. On the other hand, a stress occurred in the vicinity interface of the capacitor line 300 may be relaxed by not applying such baking to the second insulation interlayer 42.

The data line 6a is formed on the second insulation interlayer 42, and a third insulation interlayer 43, in which the contact hole 85 communicating with the relay 71 is formed through, is formed over them.

The surface of the third insulation interlayer 43 is planarized by CMP (Chemical Mechanical Polishing) treatment in order to ameliorate poor orientation of the liquid crystal layer 50 ascribed to steps caused by various wiring lines and elements formed under the third insulation interlayer. However, grooves may be formed on at least one of the TFT array substrate 10, the insulation underlayer 12, the first insulation interlayer 41, and the second insulation interlayer 42 so as to embed the wiring lines such as the data line 6a and TFT 30 in place of or in addition to applying the planarizing treatment to the third insulation interlayer 43.

Figure 4:
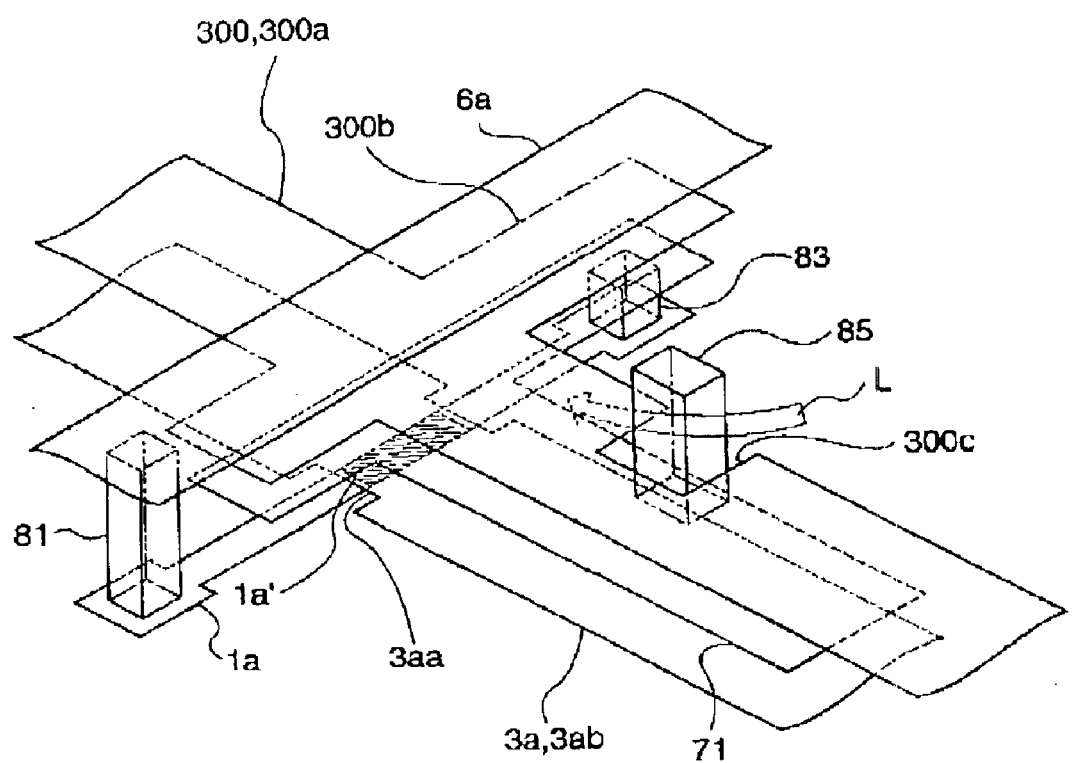
FIG. 4 is a perspective view showing a three dimensional relation of the scanning lines including a narrow part and a wide part, a channel region and an arrangement around them.
Figure 5:
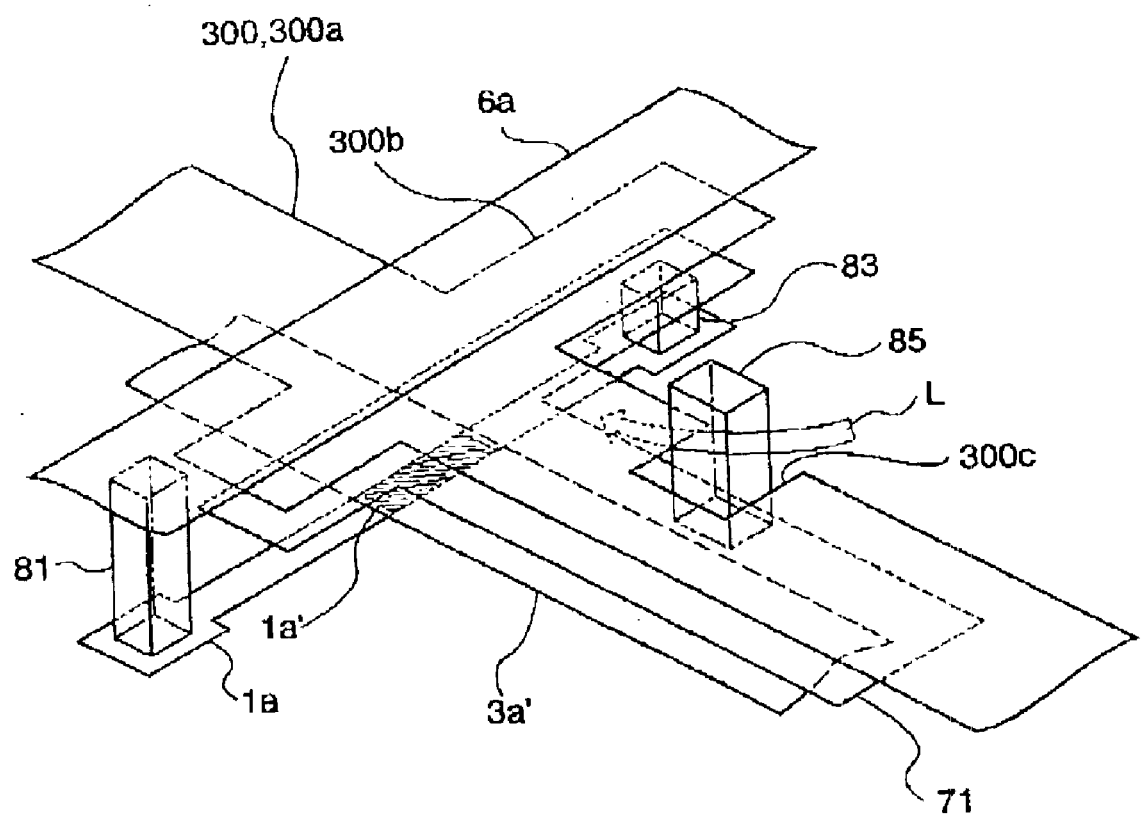
FIG. 5 is a perspective view showing a three dimensional relation of the scanning lines and arrangement around them of the conventional electro-optical device.

The following function and effect are exerted by forming the scanning line 3a including the narrow part 3aa and wide part 3ab described above, in the electro-optical device of the first embodiment having the construction as described above. These function and effect are described below with reference to FIGS. 4 and 5. FIG. 4 is a perspective view showing a three dimensional relation among the scanning line 3a including the narrow part 3aa and wide part 3ab as well as the semiconductor layer 1a, data line 6a, capacitor line 300, and relay layer 71 as described above, and contact holes 81 and 85. FIG. 5 is a perspective view of the conventional electro-optical device having the same meaning as described above, but does not contain the scanning line 3a. However, all the construction elements shown in FIGS. 2 and 3 are not shown in FIGS. 4 and 5, and some of the elements, for example the dielectric layer 75 constituting the accumulating capacitor 70, are appropriately omitted therein.

With reference to the conventional example in FIG. 5, it is shown that a light L, advancing aslant, easily arrives at the channel region 1a', since the scanning line 3a' has a uniform width along its extending direction. Accordingly, a leak photocurrent can occur in the channel region 1a' by excitation due to invasion of the light L. Consequently, a constant current (leak photocurrent) flows despite the TFT 30 is turned off. Therefore, display of high quality images can be rather difficult due to flicker on the images.

On the contrary, the light L, advancing aslant as in FIG. 5, is blocked from invading by the wide part 3ab in the scanning line 3a according to the first embodiment as shown in FIG. 4, and the light L does not arrive at the channel region 1a'. Accordingly, possibility of the drawback as described above may be reduced in the first embodiment.

The wide part 3ab and the data line 6a shares a region where they are overlapped with each other with an width of Wp in the first embodiment as shown in FIGS. 2 and 4. Consequently, the function and effect for suppressing the leak photocurrent from occurring and displaying high quality images are more reliably exerted, since the advancing passageway of the light toward the channel region 1a' is further restricted. More precisely, for example, a part of the light advancing from the upward of the data line 6a in FIG. 4 is reflected or absorbed by the surface of the data line 6a, and a residual light arriving at the lower face of the data line 6a, if any, is blocked by the wide part 3ab.

Since the lower side light shielding layer 11a is additionally provided according to the first embodiment, the incident light to the TFT 30 is blocked at both upper and lower sides, thereby enabling more reliable light shielding function to be exerted.

While the narrow part 3aa and wide part 3ab are elongated with each other in the first embodiment, it should be understood that the present invention is not restricted only to such construction. For example, the wide part 3ab having the light shielding material may be formed after forming only the narrow part 3aa with the conductive polysilicon layer in order to attain electrical continuity with the polysilicon layer, that is, in order to electrically connect between the narrow part 3aa and wide part 3ab. Since the narrow part 3aa as the gate electrode can be formed with a material having good compatibility with the semiconductor layer 1a, an electro-optical device capable of stable operation may be provided. Furthermore, the electro-optical device may have a high light shielding function by providing the wide part having the light shielding material.

In relation to the description above, the scanning line 3a may have a bilayer structure such that the lower layer and the upper layer thereof include the polysilicon layer and light shielding material, respectively. Since the portion, which faces the semiconductor layer 1a with interposition of the insulation layer 2 and is required to function as the gate electrode, is the polysilicon layer compatible with the semiconductor layer, the same function and effect as described above may be obtained.

While the wide part 3ab is formed so as to be elongated in both elongation directions of the channel region 1a' as viewed from the side line of the narrow part 3aa, the wide part 3ab may be formed so as to be elongated in only one direction.

The second embodiment of the invention will be described hereinafter with reference to FIGS. 6 and 7. FIGS.

6 and 7 are a plan view and perspective view, respectively, having the same meaning as in FIGS. 2 and 4, but the shape of the scanning line is different from that in FIGS. 2 and 4. Since the construction of the electro-optical device according to the second embodiment is the same as that in the first embodiment, unless otherwise stated, descriptions for same numerals of the figures will be omitted.

Figure 6:
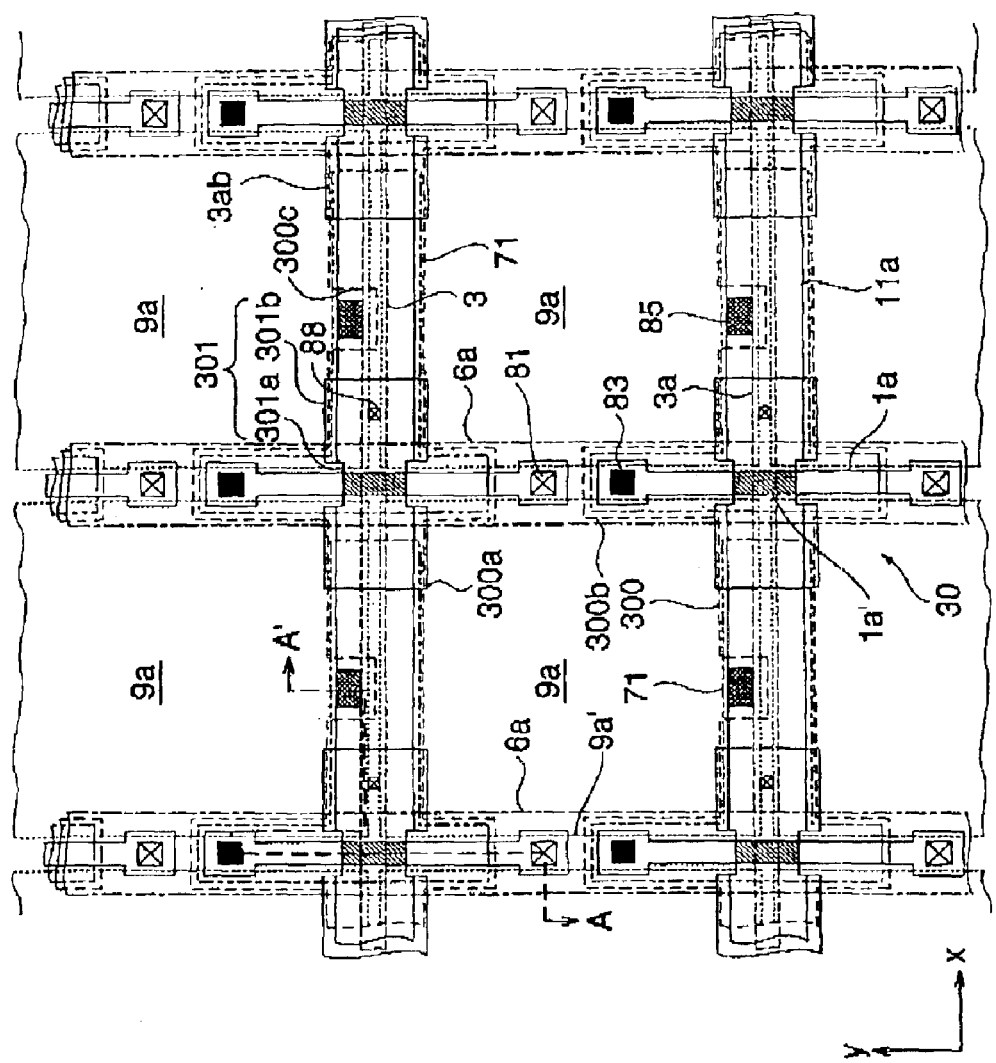
FIG. 6 is a drawing having the same meaning as in FIG. 2, wherein the drawing shows a plan view of the electro-optical device having an electrode part having the narrow part and wide part according to the second embodiment.
Figure 7:
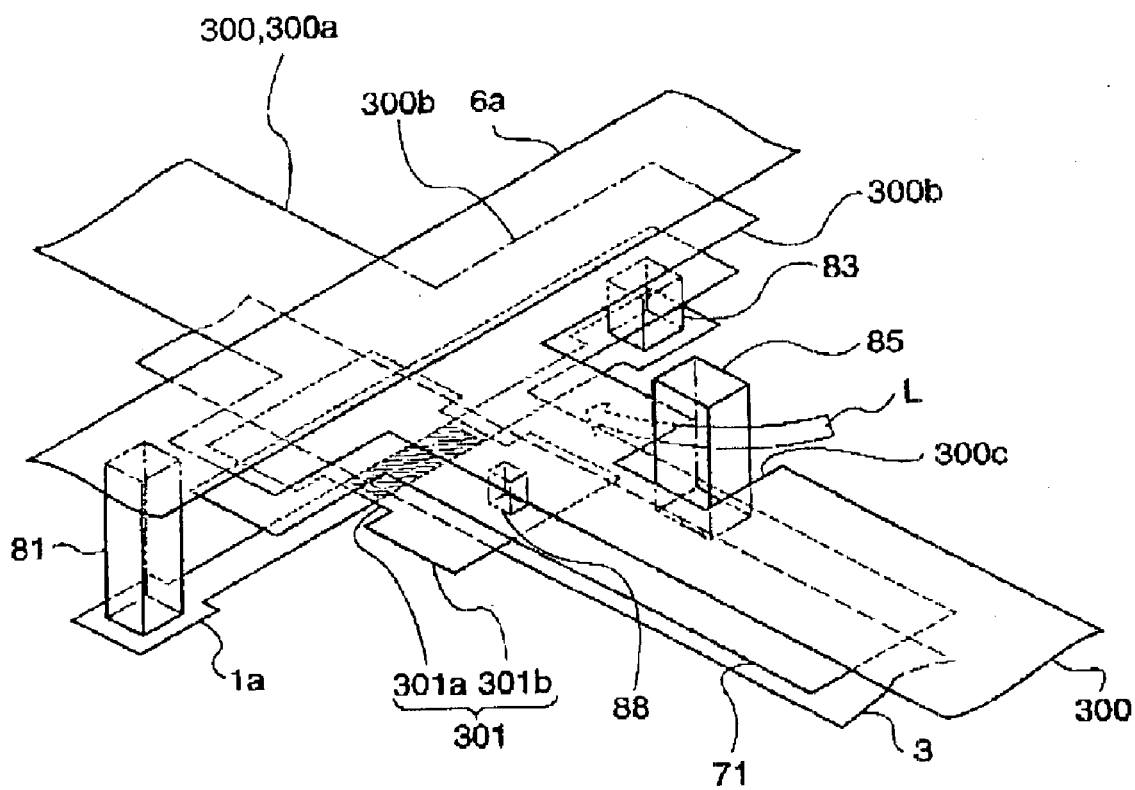
FIG. 7 is a drawing having the same meaning as in FIG. 4, wherein the drawing shows a plan view of the electro-optical device having an electrode part having the narrow part and wide part according to the second embodiment.

Different from the first embodiment having the scanning line 3a including the narrow part 3aa and wide part 3ab, the second embodiment comprises an electrode part 301 including a narrow part 301a and wide part 301b as shown in FIGS. 6 and 7. As shown in FIG. 6, the electrode part 301 is formed as islets, on the TFT array substrate 10, corresponding to the region for forming the TFT 30, and each of the islet of the electrode part contains the narrow part 301a facing the channel region 1a' and the wide part 301b not facing the channel region 1a'. The outline of the structure in the second embodiment is the same as that in the first embodiment when only the narrow part 301a and wide part 301b are noticed. In other words, the width of the narrow part 301a is defined to be approximately the same as the channel length, and the wide part 301b is formed so as to protrude out of both side lines of the narrow part 301a (that is, to protrude in both +y and −y directions in FIG. 6). On the other hand, the electrode part 301 is electrically connected to the scanning line 3, formed under the TFT 30 with interposition of the inter-insulation layer, via a contact hole 88.

It is evident that the light shielding effect by the wide part 301b can be manifested as the wide part 3ab does in the structure as described above.

It is also possible in the structure above to enhance the degree of freedom of layout, such as an arrangement of the electrode part 301 and scanning line 3 as well as the TFT closely related thereto, while constructing the electrode part 301 and scanning line 3 by different materials.

The overall construction of the electro-optical device in each embodiment so constructed as described above will be described hereinafter with reference to FIGS. 8 and 9.

Figure 8:
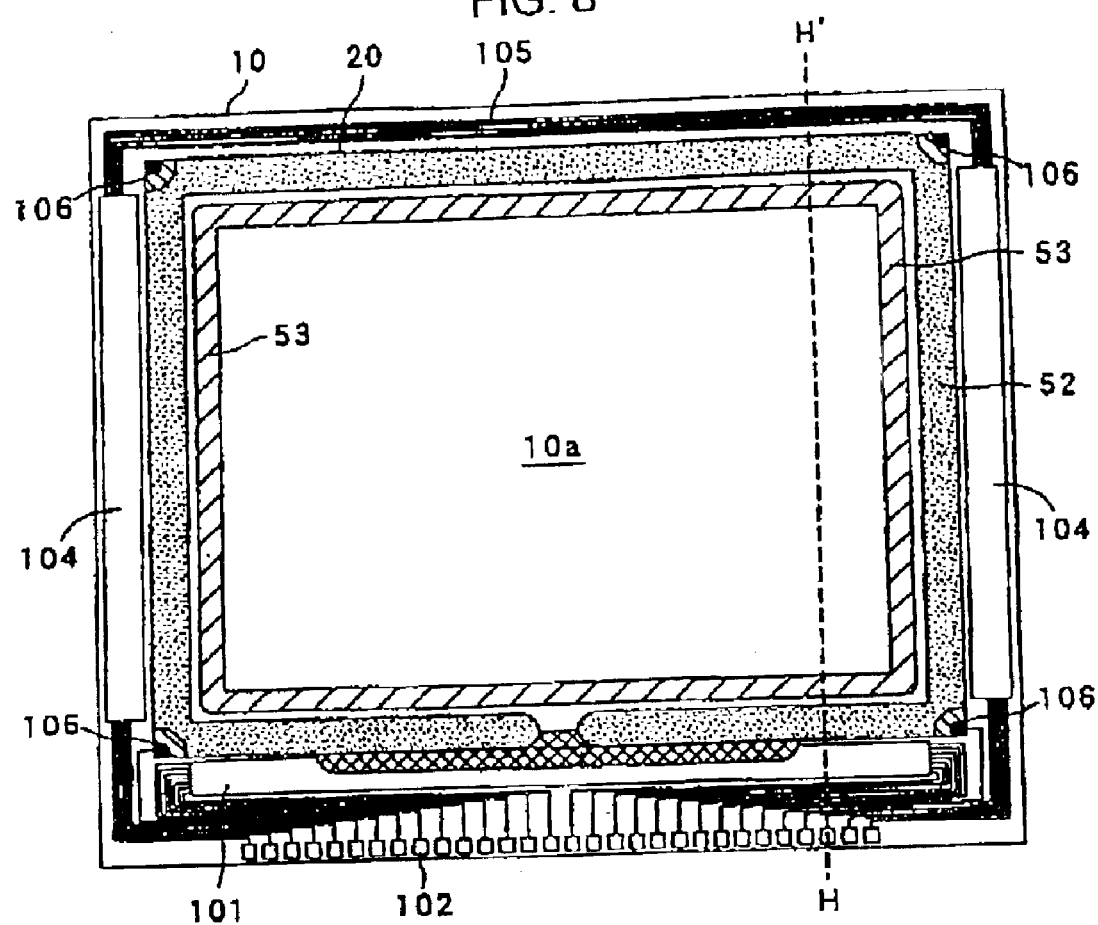
FIG. 8 is a plan view of the TFT array substrate in the electro-optical device with constituting elements formed on the TFT array substrate in an embodiment of the invention, which is viewed from a counter substrate side.
Figure 9:
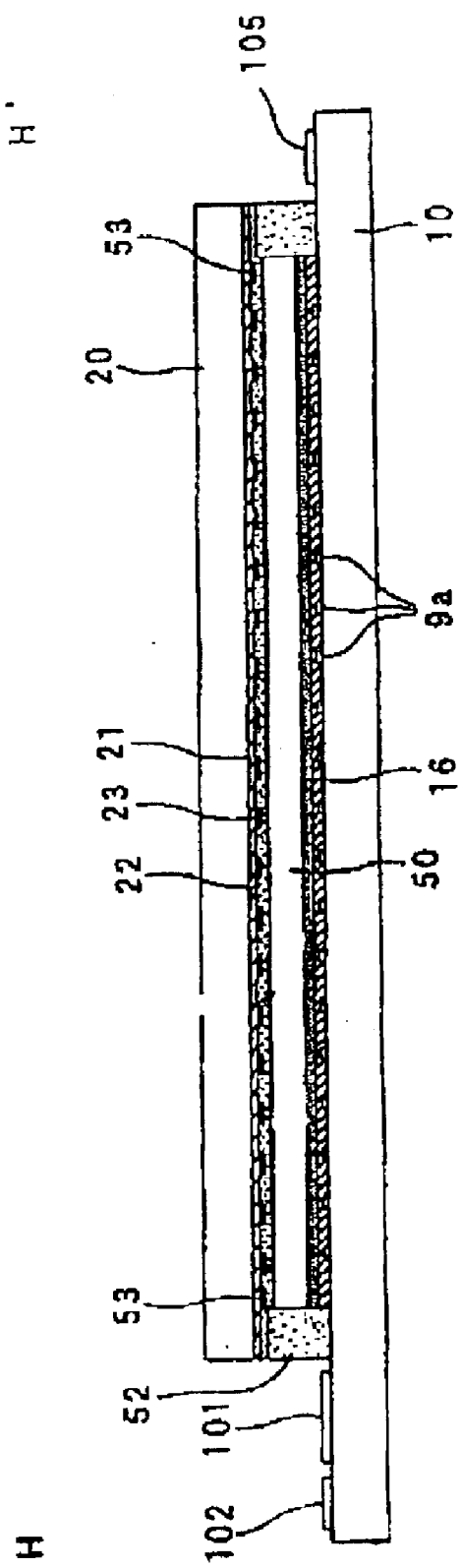
FIG. 9 is a cross sectional view along the line H—H' in FIG. 8.

FIG. 8 is a plan view of the TFT array substrate in the electro-optical device with constituting elements formed on the TFT array substrate, viewed from an counter substrate 20 side, and FIG. 9 is a cross sectional view along the line H—H' in FIG. 8.

In FIGS. 8 and 9, the TFT array substrate 10 faces the counter substrate 20 in the electro-optical device according to the embodiments of the invention. A liquid crystal layer 50 is sealed between the TFT array substrate 10 and the counter substrate 20, and the TFT array substrate 10 is bonded to the counter substrate 20 with a seal member 52 provided at a seal region located around the periphery of an imaging region 10a.

The seal member can include a UV curable resin or heat-setting resin for bonding the both substrates with each other, and the resin is cured with a UV light or by heating. Gap materials (spacer), such as glass fibers and glass beads for maintaining a particular gap distance between the substrates, are dispersed in the seal member 52, when the electro-optical device of the embodiments is applied for a small size liquid crystal device for magnification display such as a projector. Alternatively, the gap material may be included in the liquid crystal layer 50, when the electro-optical device is applied for a large size liquid crystal device for displaying a object with its original scale, such as a liquid crystal display device and liquid crystal television.

A data line addressing circuit 101 that addresses the data line 6a by supplying image signals to the data line 6a at a given timing, and auxiliary circuit connection terminals 102, are provided at the external region of the seal member 52 along one side of the TFT array substrate 10. A scanning line addressing circuit 104 that addresses the scanning line 3a by supplying scanning signals to the scanning line 3a at a given timing, is provided along the other two sides adjacent to the side described above.

The scanning line addressing circuit 104 may be provided at only one side when the delay of the scanning signals, supplied to the scanning line 3a, does not cause any troubles. The data line addressing circuit 101 may be placed along two sides of the image display region 10a.

A plurality of wiring lines 105 are provided at the remaining one side of the TFT array substrate 10 in order to connect the scanning line addressing circuits 104 provided at both sides of the image display region 10a.

Conductive members 106 are provided at least at one corner part of the counter substrate 20 for electrical continuity between the TFT array substrate 10 and counter substrate 20.

As shown in FIG. 9, after forming the pixel switching TFT and wiring lines, such as scanning lines and data lines on the TFT array substrate, an orientation layer is formed on the pixel electrode 9a. On the other hand, the counter substrate 20 can include the counter electrode 21 as well as the orientation layer at the uppermost layer of the counter substrate. The liquid crystal layer 50 includes, for example, one kind of nematic liquid crystal or a mixture of several kinds of nematic liquid crystals, and liquid crystal molecules take a predetermined orientation between a pair of the orientation layers.

A sampling circuit for applying image signals to a plurality of the data lines 6a at a given timing, a pre-charge circuit for supplying a given voltage level of pre-charge signals to the plural data lines 6a, and an inspection circuit for inspecting the quality and defects of the electro-optical device at the time of the manufacturing process and shipping of the electro-optical device, may be formed on the TFT array substrate 10, in addition to the data line addressing circuit 101 and scanning line addressing circuit 104.

The data line addressing circuit 101 and scanning line addressing circuit 104 may be electrically and mechanically bonded to an addressing LSI mounted on TAB (Tape Automated Bonding) substrate via anisotropic conductive films provided at the periphery of the TFT array substrate 10, in place of providing them on the TFT array substrate 10. A polarizing film, phase contrast film or polarizer is disposed with a given orientation at the incidence side of the counter substrate 20, from which the incident light enters the counter substrate 20, and at the emergence side of the emitted light from TFT array substrate 10, depending on operation modes such as a TN (Twisted Nematic) mode, VA (Vertically Aligned) or PDLC (Polymer Dispersed Liquid Crystal) mode, and a normally white mode or a normally black mode.

Figure 10:
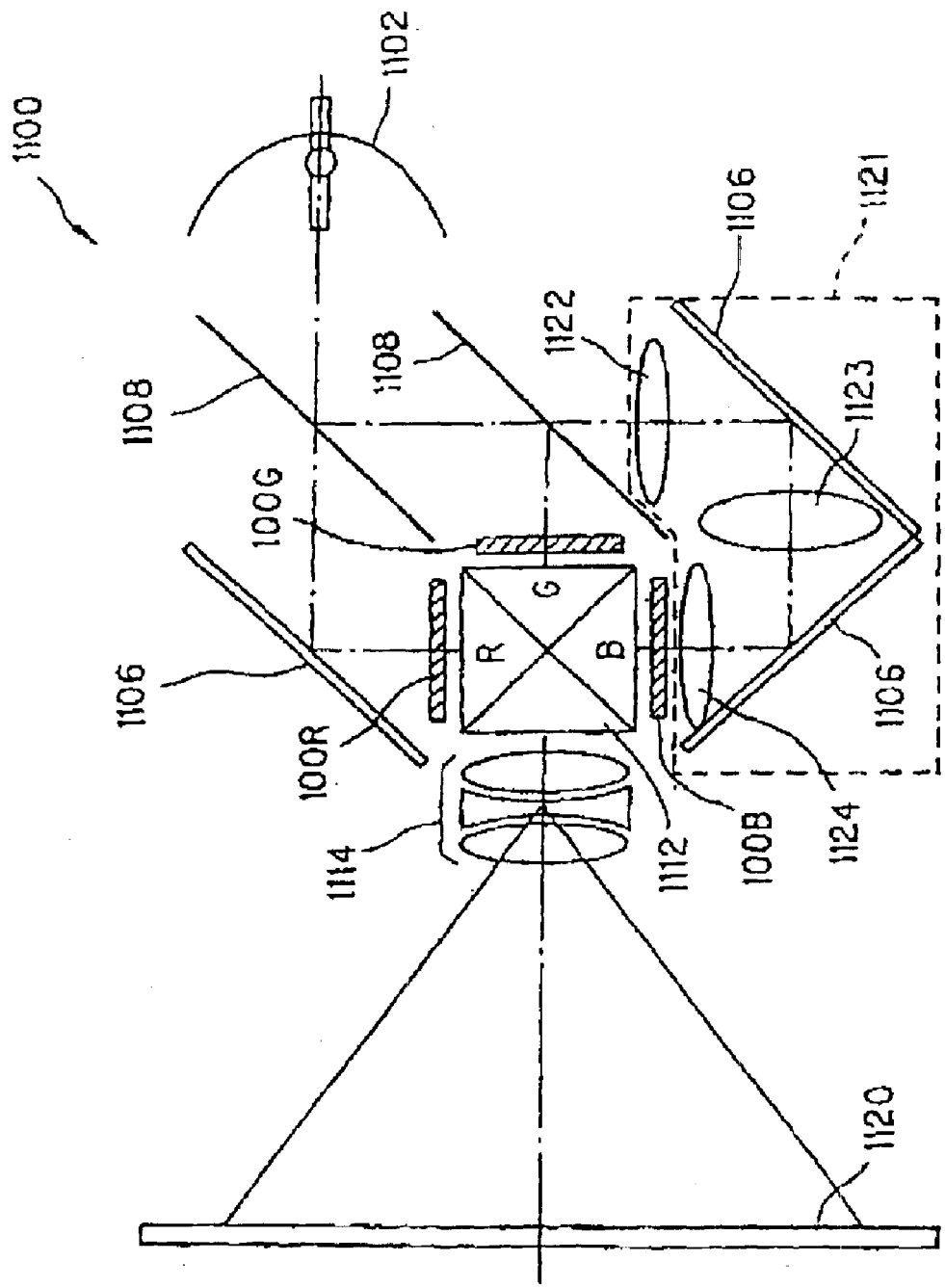
FIG. 10 is a schematic cross sectional view showing a color liquid crystal projector as an example of a projection color display device as an embodiment of the electronic apparatus of the invention.

The overall construction, particularly the optical construction of the electro-optical device that has been described in detail above, will be described below with respect to an embodiment of a projection type color display device as an example of the electronic apparatus in which the electro-optical device is used as a light bulb. FIG. 10 shows a schematic cross sectional view of the projection type color display device.

The liquid crystal projector 100, an example of the projection type color display device in this embodiment, can include three liquid crystal modules including the liquid crystal devices, each having an addressing circuit mounted on the TFT array substrate, and the modules are used for the RBG light bulbs 100R, 100G and 100B, respectively, in the projector. When a light is emitted from a white light source 1102, such as a metal halide lamp in the liquid crystal projector 1100, the light is split into light components R, G and B corresponding to three primary colors with three mirrors 1106 and two dichroic mirrors 1108, and each light is guided to the light bulb 100R, 100G or 100B corresponding to each color. The light B is particularly guided through a relay lens system 1121 having an incidence lens 1122, a relay lens 1123, and an emergence lens 1124 in order to prevent light loss due to a long light passageway. The light components corresponding to the three primary colors modulated by the light bulbs 100R, 100G and 100B, respectively, are synthesized again with a dichroic prism 1112, and are projected as color images on a screen 1120 thorough a projection lens 1114.

It should be understood that the invention is not restricted to the embodiments as described above, and is able to be appropriately modified without departing from the scope and spirit of the invention. An electro-optical device and an electronic apparatus involving such modifications are considered to be included in the scope of the invention.

What is claimed is:

1. An electro-optical device, comprising:
   a pixel electrode provided above a substrate;
   a thin film transistor having a channel region that supplies image signals to the pixel electrode by switching operations of the thin film transistor;
   a first wiring line that supplies the image signals to the thin film transistor; and
   a second wiring line that supplies scanning signals to the thin film transistor for controlling the switching operations of the thin film transistor,
   the second wiring line having a narrow part as a gate electrode facing the channel region of the thin film transistor, and a wide part wider than the narrow part and not facing the channel region.

2. The electro-optical device according to claim 1, at least a portion of the wide part having a region overlapping the first wiring line in a plan view.

3. The electro-optical device according to claim 1, the wide part including a region extended from the narrow part.

4. The electro-optical device according to claim 1, the wide part including a region connected from the narrow part.

5. The electro-optical device according to claim 1, the wide part having a light shielding material.

6. The electro-optical device according to claim 1, at least one of the second wiring line and an electrode part having a multilayer structure.

7. The electro-optical device according to claim 1, the wide part being extended to one or both extending directions of the channel region viewed from the side line of the narrow part.

8. The electro-optical device according to claim 1, comprising the pixel electrodes arranged as a matrix,
   the channel region being formed in each cross point region, in which a first slender space, extending so as to thread through adjoining pixel electrodes with interposition of the second wiring line in a plan view, intersects a second slender space, extending so as to thread through adjoining pixel electrodes with interposition of the first wiring line in a plan view.

9. The electro-optical device according to claim 8, comprising the channel region, a source region, and a drain region formed so as to extend along the second space,
   a width of the narrow part being equal to a length of the channel region along the second space, and
   a width of the wide part being larger than the length of the channel region along the second space.

10. The electro-optical device according to claim 1, a lower side light shielding layer being further provided under the thin film transistor.

11. An electronic apparatus having a electro-optical device, comprising:
    a pixel electrode provided above a substrate;
    a thin film transistor having a channel region that supplies image signals to the pixel electrodes by switching operations of the thin film transistor;
    a first wiring line that supplies the image signals to the thin film transistor; and
    a second wiring line for that supplies scanning signals to the thin film transistor for controlling the switching operations of the thin film transistor,
    the second wiring line including a narrow part as a gate electrode facing the channel region of the thin film transistor, and a wide part wider than the narrow part and not facing the channel region.

12. An electro-optical device comprising:
    a pixel electrode provided above a substrate;
    a thin film transistor that supplies image signals to the thin film transistor by controlling the switching operations of the thin film transistor;
    a first wiring line that supplies the image signals to the thin film transistor;
    a second wiring line that supplies scanning signals to the thin film transistor for controlling the switching operations of the thin film transistor; and
    an electrode part having a narrow part as a gate electrode facing the channel region of the thin film transistor, and a wide part wider than the narrow part and not facing the channel region,
    the electrode part being electrically coupled to the second wiring line.

13. The electro-optical device according to claim 12, the electrode part and the second wiring line being electrically coupled via a contact hole.

14. The electro-optical device according to claim 12, at least a part of the wide part having an area overlapping the first wiring line in plan view.

15. The electro-optical device according to claim 12, the wide part including a part extended from the narrow part.

16. The electro-optical device according to claim 12, the wide part including a part connected from the narrow part.

17. The electro-optical device according to claim 12, the wide part having a light shielding material.

18. The electro-optical device according to claim 12, at least one of the second wiring line and the electrode part having a multilayer structure.

19. The electro-optical device according to claim 12, the wide part being extended to one or both extending directions of the channel region viewed from the side line of the narrow part.

20. The electro-optical device according to claim 12, comprising the pixel electrodes arranged as a matrix,
    the channel region being formed in each cross point region, in which a first slender space, extending so as to thread through adjoining pixel electrodes with interposition of the second wiring line in a plan view, intersects a second slender space, extending so as to thread through adjoining pixel electrodes with interposition of the first wiring line in a plan view.

21. The electro-optical device according to claim 20, comprising the channel region, the source region, and the drain region formed so as to extend along the second space,
    a width of the narrow part being equal to the length of the channel region along the second space, and
    a width of the wide part being larger than said length.

22. The electro-optical device according to claim 20, a lower light shielding layer being further provided under the thin film transistor.

23. An electronic apparatus having an electro-optical device, comprising:
- a pixel electrode provided above a substrate;
- a thin film transistor that supplies image signals to the pixel electrodes by switching operations of the thin film transistor;
- a first wiring line that supplies the image signals to the thin film transistor;
- a second wiring line that supplies scanning signals to the thin film transistor for controlling the switching operations of the thin film; and
- an electrode part comprising the second wiring line having a narrow part as a gate electrode facing the channel region of the thin film transistor, and a wide part wider than the narrow part and not facing the channel region, the electrode part being electrically coupled to the second wiring line.

* * * * *